United States Patent
Liu et al.

(10) Patent No.: US 12,021,492 B2
(45) Date of Patent: Jun. 25, 2024

(54) RADIO FREQUENCY POWER AMPLIFIER

(71) Applicant: InPlay, Inc., Irvine, CA (US)

(72) Inventors: Ruifeng Liu, Irvine, CA (US); Russell Mohn, Santa Ana, CA (US)

(73) Assignee: INPLAY, INC., Irvine, CA (US)

( * ) Notice: Subject to any disclaimer, the term of this patent is extended or adjusted under 35 U.S.C. 154(b) by 543 days.

(21) Appl. No.: 17/303,292

(22) Filed: May 26, 2021

(65) Prior Publication Data

US 2022/0385248 A1    Dec. 1, 2022

(51) Int. Cl.
*H03F 3/217*    (2006.01)
*H03F 1/56*    (2006.01)
*H03F 3/193*    (2006.01)
*H03F 3/24*    (2006.01)

(52) U.S. Cl.
CPC ............ *H03F 3/245* (2013.01); *H03F 1/565* (2013.01); *H03F 3/193* (2013.01); *H03F 3/2171* (2013.01); *H03F 2200/171* (2013.01); *H03F 2200/451* (2013.01)

(58) Field of Classification Search
CPC ...... H03F 3/217; H03F 3/2173; H03F 3/2171; H03F 2200/351; H03F 3/245; H03F 1/565; H03F 3/193; H03F 2200/171; H03F 2200/451
USPC ........................................ 330/10, 207 A, 251
See application file for complete search history.

(56) References Cited

U.S. PATENT DOCUMENTS

| | | | | |
|---|---|---|---|---|
| 7,705,675 B2* | 4/2010 | McMorrow | ............. | H04B 1/44 330/262 |
| 7,816,985 B2* | 10/2010 | Attwood | ............... | H03F 3/2173 330/10 |
| 8,400,778 B2* | 3/2013 | Hsing | ..................... | H01R 9/00 257/691 |
| 2009/0096511 A1* | 4/2009 | Ueunten | ............. | H03K 17/122 327/543 |

OTHER PUBLICATIONS

Engstrand et al., "Simulation and Construction of a Half-Bridge Class D Audio Amplifier", 2018, Uppsala Universitet, Uppsala.

* cited by examiner

*Primary Examiner* — Khanh V Nguyen
(74) *Attorney, Agent, or Firm* — INNOVATION CAPITAL LAW GROUP, LLP; Vic Lin

(57) ABSTRACT

A class-D RF power amplifier (PA) architecture with duty cycle control has improved power efficiency while suppressing even-order harmonics. An inductor and capacitor (LC) low pass filter (LPF) can also be integrated on-chip to further suppress harmonics and provide impedance transformation between the PA and load. This eases the design for customers and reduce their bill of materials cost. The LPF can also match the PA to the load impedance to improve efficiency. The harmonic levels can also be controlled by adjusting the duty cycle of the PA output.

17 Claims, 7 Drawing Sheets

RADIO FREQUENCY POWER AMPLIFIER

BACKGROUND OF THE INVENTION

1. Field of the Invention

Embodiments of the invention relate generally to power amplifiers. More particularly, embodiments of the invention relate to a high efficiency class-D radio frequency (RF) power amplifier (PA) with duty cycle control. The PA can include an integrated low pass filter for harmonic suppression.

2. Description of Prior Art and Related Information

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

Low-power portable electronics derive their power from batteries. To make a battery last longer, the power consumption of the electronics must be reduced. A transmitter PA is usually one of the most power-hungry circuit blocks in a radio system. Therefore, reducing overall radio system power consumption means designing an efficient PA.

A non-linear switching PA is suitable for constant envelope modulation where information is not encoded in the amplitude of the radio carrier. A switching PA can be designed with significantly higher efficiency than a linear PA by minimizing the time that large currents and voltages occur simultaneously. A class-D PA can achieve high efficiency at low output power levels, making it a very competitive architecture for low power, short range applications.

The spectrum used as a common medium for wireless communication is becoming increasingly more crowded. To limit interference under acceptable levels, communication regulation agencies, such as the FCC, impose strict limits on out-of-band emissions from transmitters. In nonlinear modulated transmitters, harmonics are usually the main contributors to out-of-band emissions.

A typical class-D amplifier is shown in FIG. 1. If the two transistors are both turned on, a short circuit forms between the power supply and ground, which is called "shoot through". Shoot through causes large heat and high power loss. A two phase non-overlapping signal generator is commonly used to make the driving signals at the gates of the two output transistors not overlapping. However, as the frequency increases, the power consumption of the non-overlapping generator increases. In addition, the signal frequency is also limited because the technique relies on feedback.

In view of the foregoing, there is a need for a high efficiency class-D RF power amplifier that can minimize harmonics while having the ability to operate at various frequencies without shoot through.

SUMMARY OF THE INVENTION

Embodiments of the present invention provide a power amplifier comprising a driving amplifier receiving an input signal, passing the input signal through PMOS and NMOS transistors and providing a driving amplifier output signal; and at least one power amplifier unit providing class-D amplification to the driving amplifier output signal to provide a power amplifier output signal, wherein a voltage of the driving amplifier output signal controls a duty cycle of the power amplifier.

Embodiments of the present invention further provide a method of amplifying a signal with a power amplifier comprising providing the signal to a driving amplifier; controlling the driving amplifier with a duty cycle control signal to increase or decrease an output voltage of the driving amplifier, wherein a greater output voltage provides a decreased duty cycle of the power amplifier; providing a driving amplifier output signal to a power amplifier unit, the power amplifier unit providing a class-D power amplification of the signal; and outputting a power amplifier output signal from the power amplifier unit.

Embodiments of the present invention also provide a method of amplifying a signal with a power amplifier comprising providing the signal to a driving amplifier; controlling the driving amplifier with a duty cycle control signal to increase or decrease an output voltage of the driving amplifier, wherein a greater output voltage provides a decreased duty cycle of the power amplifier; providing a driving amplifier output signal to a power amplifier unit, the power amplifier unit providing a class-D power amplification of the signal; outputting a power amplifier output signal from the power amplifier unit; conditioning the power amplifier output signal with an inductor-capacitor filter, wherein each of the at least one power amplifier unit includes a first power electronics arrangement having a first set of transistors and a second set of transistors, wherein the driving amplifier output signal is split to feed each of the first and second set of transistors, wherein each of the first and second sets of transistors include a PMOS transistor and an NMOS transistor, wherein an output from the first power electronics arrangement is provided to a second power electronics arrangement having an architecture the same as the first power electronics arrangement, wherein a first and second output from the second power electronics arrangement is provided to a p-type transistor and an n-type transistor, respectively, to provide the power amplifier output signal; and the method further includes designing a driving capability of the first set of transistors to be stronger than that of the second set of transistors, wherein a first rising edge of the first output happens earlier than a second rising edge of the second output, and the ratio of $S_{PMN2}$ to $S_{NMN2}$ is designed smaller than that of $S_{PMP2}$ to $S_{NMP2}$ to make the falling edge of vn earlier than the falling edge of vp, where S denotes the ratio of transistor's channel width to length, preventing shoot through.

These and other features, aspects and advantages of the present invention will become better understood with reference to the following drawings, description and claims.

BRIEF DESCRIPTION OF THE DRAWINGS

Some embodiments of the present invention are illustrated as an example and are not limited by the figures of the accompanying drawings, in which like references may indicate similar elements.

Figure 1:
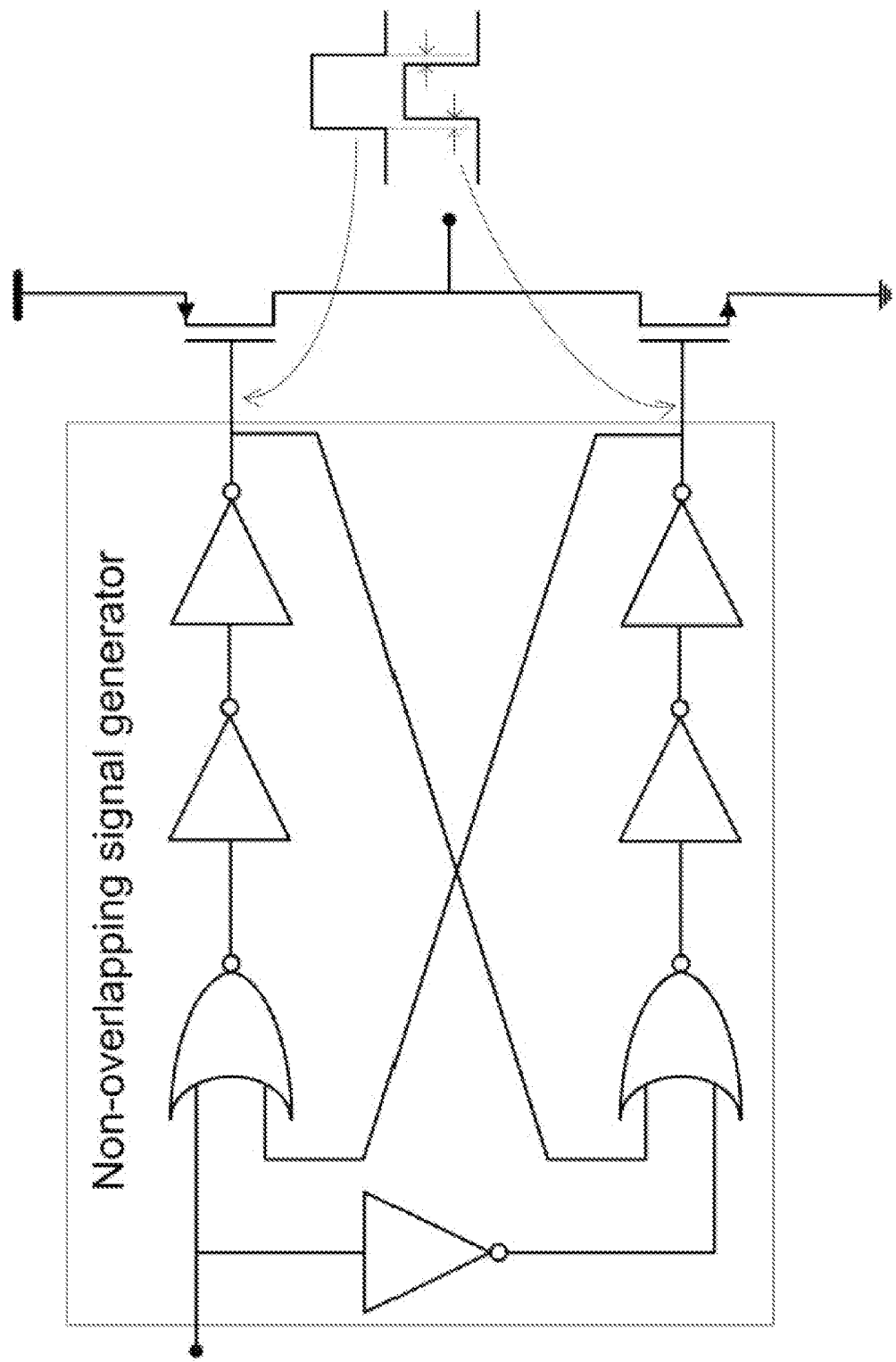
FIG. 1 illustrates a conventional class-D amplifier with non-overlapping signal generator, according to the prior art.

Unless otherwise indicated illustrations in the figures are not necessarily drawn to scale.

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

DETAILED DESCRIPTION OF THE PREFERRED EMBODIMENTS AND BEST MODE OF INVENTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In the following description, for purposes of explanation, numerous specific details are set forth in order to provide a thorough understanding of the present invention. It will be evident, however, to one skilled in the art that the present invention may be practiced without these specific details.

The present disclosure is to be considered as an exemplification of the invention and is not intended to limit the invention to the specific embodiments illustrated by the figures or description below.

As is well known to those skilled in the art, many careful considerations and compromises typically must be made when designing for the optimal configuration of a commercial implementation of any system, and in particular, the embodiments of the present invention. A commercial implementation in accordance with the spirit and teachings of the present invention may be configured according to the needs of the particular application, whereby any aspect(s), feature (s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

Broadly, embodiments of the present invention provide a class-D RF power amplifier (PA) architecture with duty cycle control to improve the power efficiency and suppress even-order harmonics. An inductor and capacitor (LC) low pass filter (LPF) can also be integrated on-chip to further suppress harmonics and provide impedance transformation between the PA and load. This eases the design for customers and reduce their bill of materials cost. The LPF can also match the PA to the load impedance to improve efficiency. The harmonic levels can also be controlled by adjusting the duty cycle of the PA output.

Figure 2:
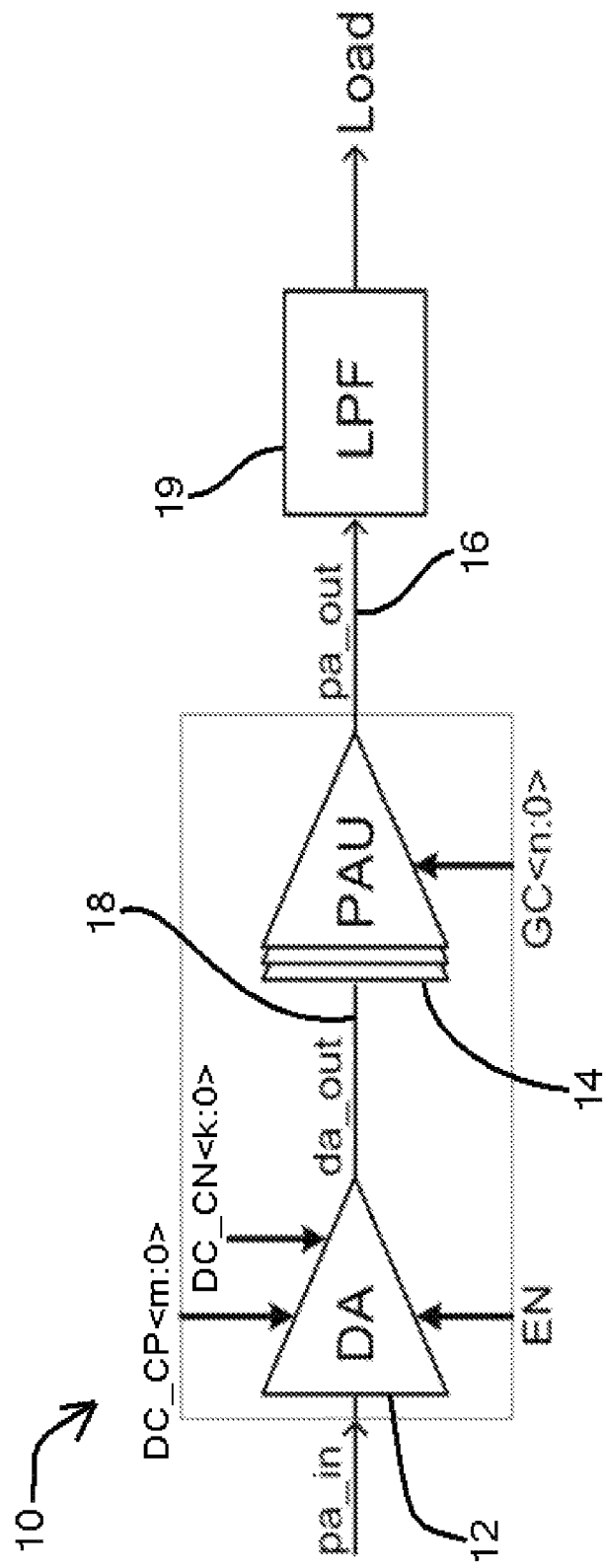
FIG. 2 illustrates a schematic representation of a power amplifier with a low pass filter, according to an exemplary embodiment of the present invention.

Referring now to FIG. 2, a power amplifier 10 can include a driving amplifier 12 with n+1 power amplifier units 14. The duty cycle of output 16 (also referred to as "pa_out") of the power amplifier can be controlled by changing the direct current (DC) output voltage 18 (also referred to as "da_out") of the driving amplifier 12. The output of the power amplifier units 14, pa_out, can pass through a low pass filter 19, as described in detail below. DC_CP<m:0>and DC_CN<k: 0>are control words made up of m+1 bits and k+1 bits respectively for duty cycle control. EN is the enable signal for the driving amplifier 12. The gain of the power amplifier 10 can be controlled by GC<n:0>.

Figure 3:
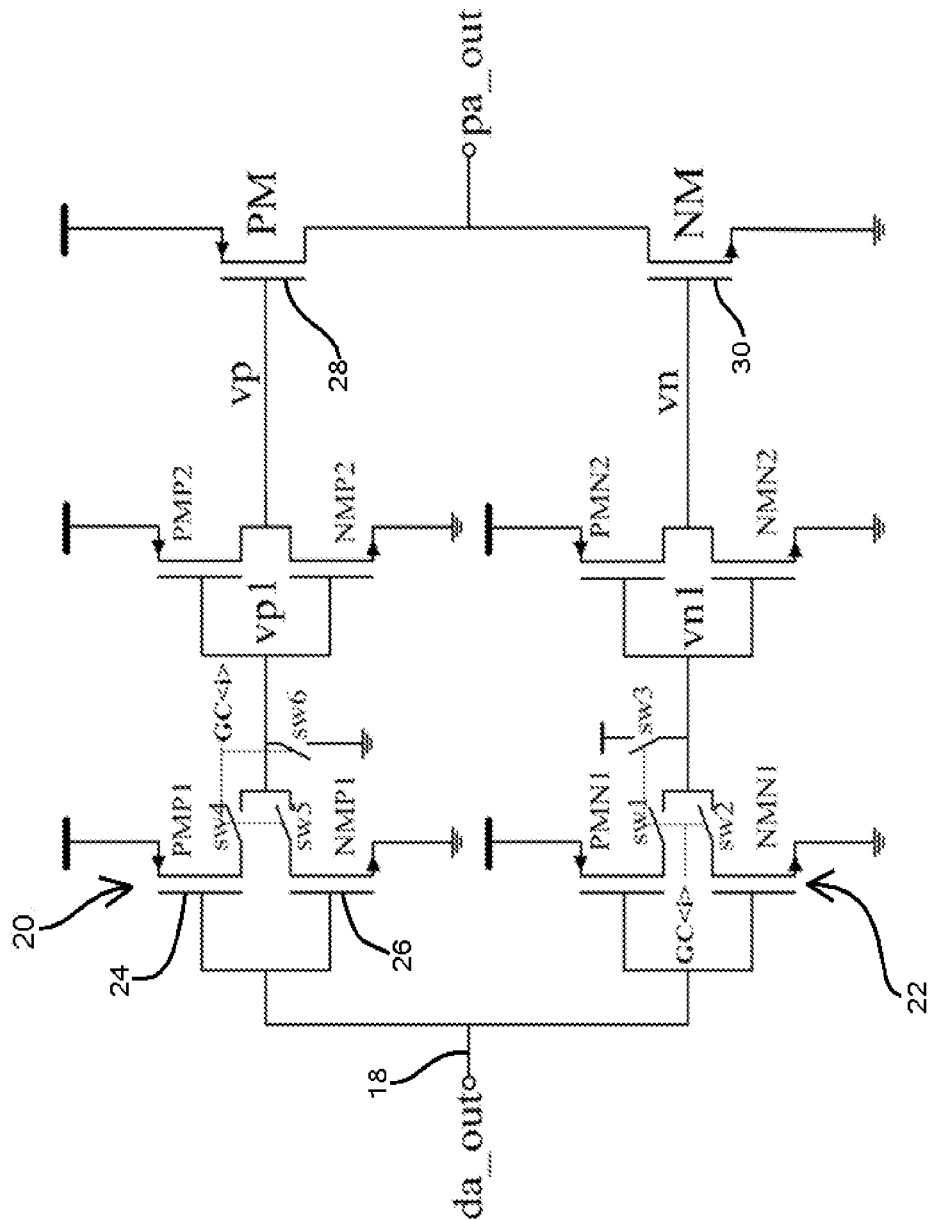
FIG. 3 illustrates a detailed schematic representation of exemplary power amplifier units of the power amplifier of FIG. 2.

Referring also to FIG. 3, the power amplifier unit 14 is shown in detail. The power amplifier unit 14 can include a first set of transistors 20 (also referred to as "PMP1" and "NMP1") and a second set of transistors 22 (also referred to as "PMN1" and "NMN1"). The DC output from the driving amplifier 12, da_out, is split to feed each of the first and second set of transistors 20, 22. Each of the first and second sets of transistors 20, 22 include a PMOS transistor 24 (such as PMP1 or PMN1) and an NMOS transistor 26 (such as NMP1 or NMN1). The output from the first and second sets of transistors 20, 22 may be fed to a similar arrangement, with transistors PMP2, NMP2, PMN2 and NMN2. The output from this arrangement, vp and vn, can be fed to a p-type transistor 28 (also referred to as "PM") and an n-type transistor 30 (also referred to as "NM"), respectively, to provide pa_out. While FIG. 2 shows one power amplifier unit, it should be understood that any number of power amplifier units may be used, depending on the particular application.

Referring to FIGS. 2 and 3, when GC<i>='0', the switches sw1/sw2/sw4/sw5 are turned off, and sw3/sw6 are turned on, this $i^{th}$ power amplifier unit is disabled, where GC<i>is one bit of GC<n:0>(0≤i≤n).

Figure 4:
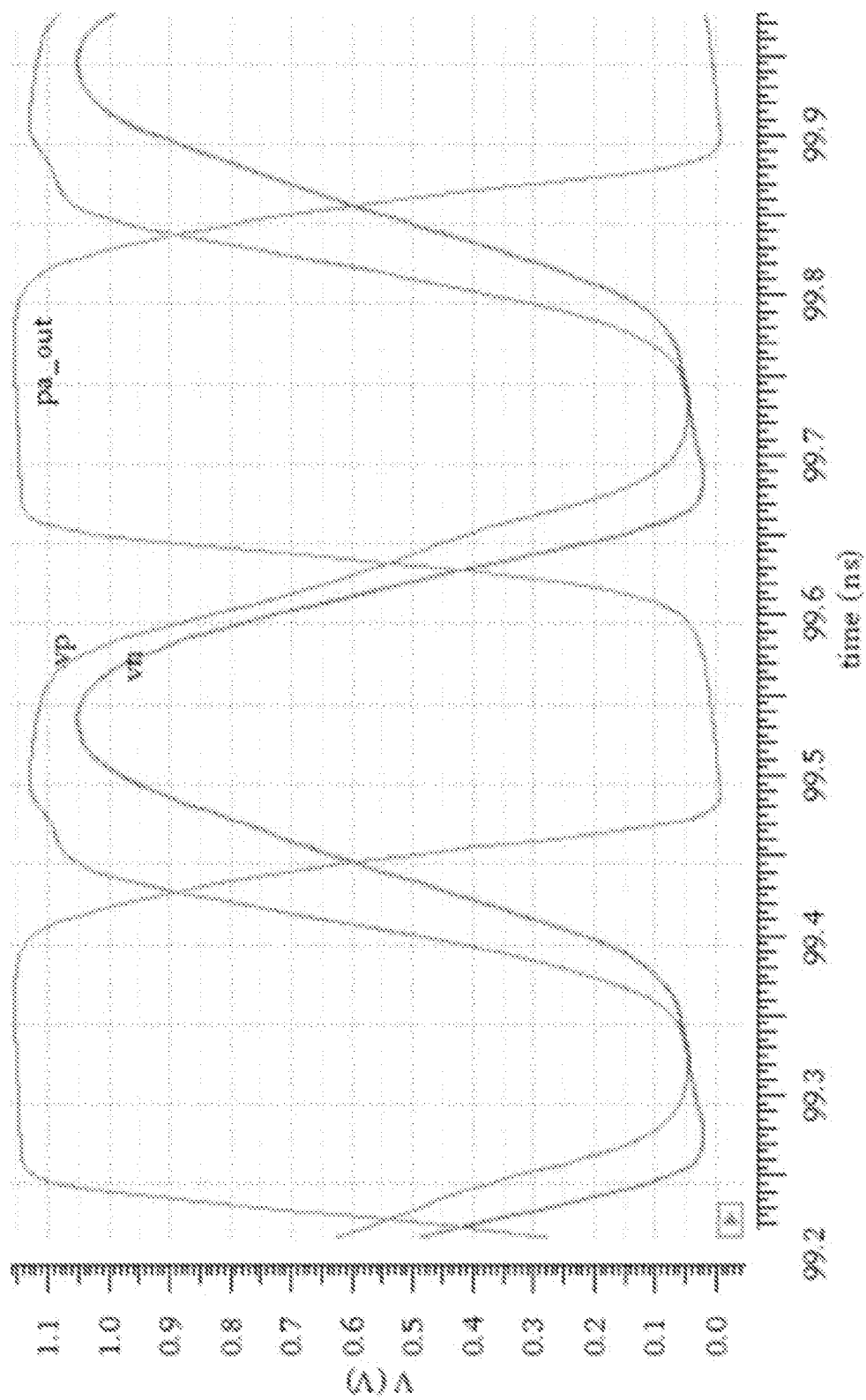
FIG. 4 illustrates a graphical representation of vp, vn and pa_out in the power amplifier units of FIG. 3.

As illustrated in FIG. 4, to avoid shoot through, the driving capability of PMN1/NMN1 and PMN2/NMN2 is designed to be weaker than that of PMP1/NMP1 and PMP2/ NMP2. Thus, the rising edge of vn happens later than the rising edge of vp. The ratio of $S_{PMN2}$ to $S_{NMN2}$ is designed smaller than that of $S_{PMP2}$ to $S_{NMP2}$ to make the falling edge of vn earlier than the falling edge of vp, where S denotes the ratio of transistor's channel width to length.

Figure 5:
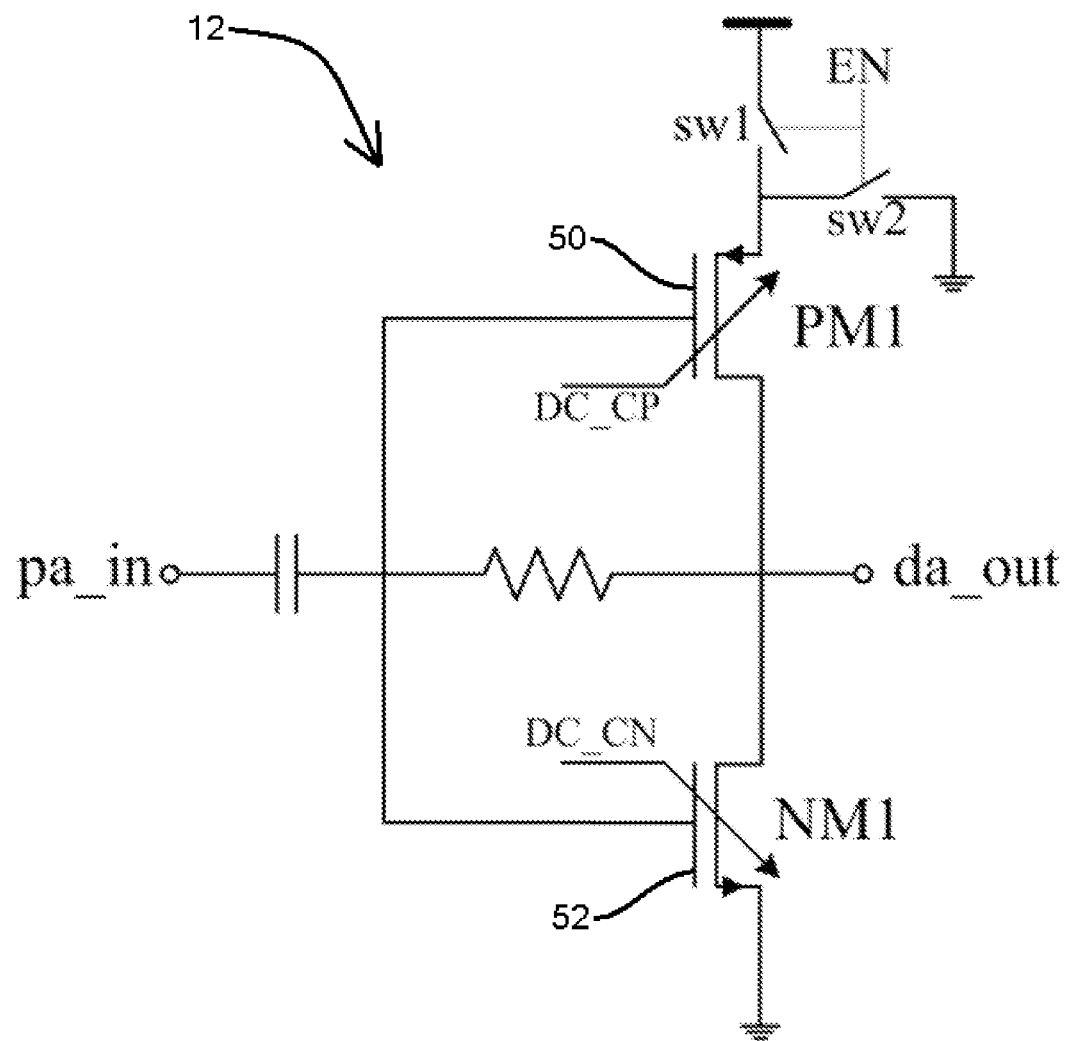
FIG. 5 illustrates a detailed schematic representation of an exemplary driving amplifier with duty cycle control of the power amplifier of FIG. 2.

The schematic of the driving amplifier 12 is shown in FIG. 5. When EN='0', the switch sw1 is turned off, and the switch sw2 is turned on, and the driver amplifier 12 is disabled. When EN='1', the driver amplifier 12 is enabled. When more PMOS transistors 50 are turned on via DC_CP<m:0>, the DC voltage of da_out increases. When more NMOS transistors 52 are turned on, via DC_CN<k:0>, the DC voltage of da_out decreases. As shown in FIG. 3, when the DC voltage of da_out increases, the duty cycle of vp1 and vn1 decreases, thus the duty cycle of vp and vn increases, and finally the duty cycle of pa_out decreases. As the DC voltage of da_out decreases, vp and vn decrease, the duty cycle of pa_out increases. Therefore, the duty cycle of the output of the power amplifier (pa_out) is controlled by DC_CP<m:0>and/or DC_CN<k:0>. This architecture is unique because the DC output voltage of the driving amplifier 12 is used to control the duty cycle of the power amplifier's output, pa_out, and therefore, the final harmonic energy emitted as radio waves, which is ultimately what is subject to legal limits.

Figure 6:
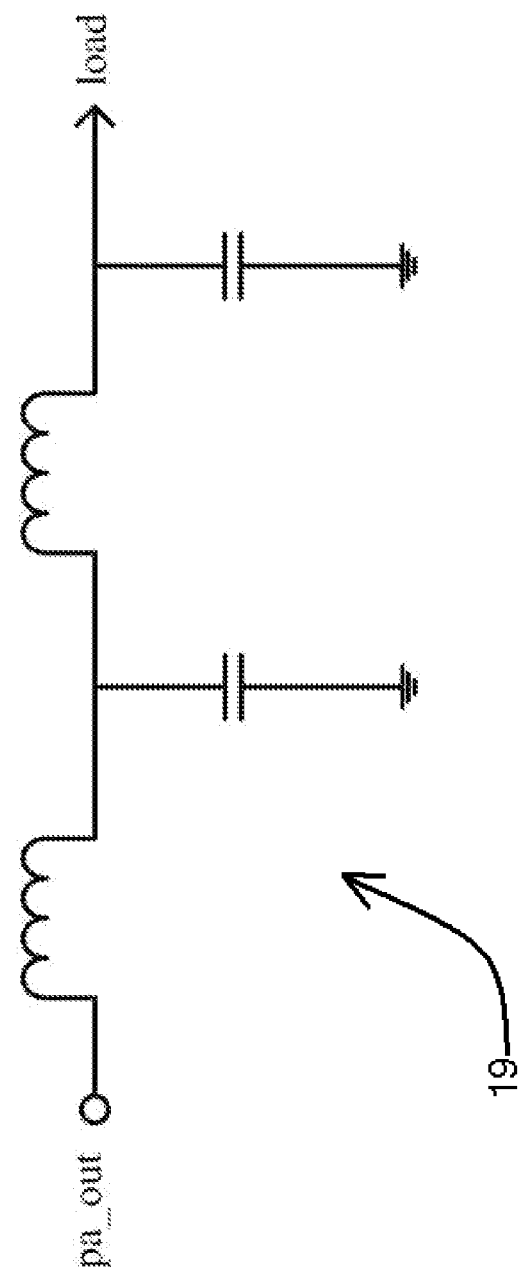
FIG. 6 illustrates a detailed schematic representation of an exemplary low pass filter used in the power amplifier of FIG. 2.
Figure 7:
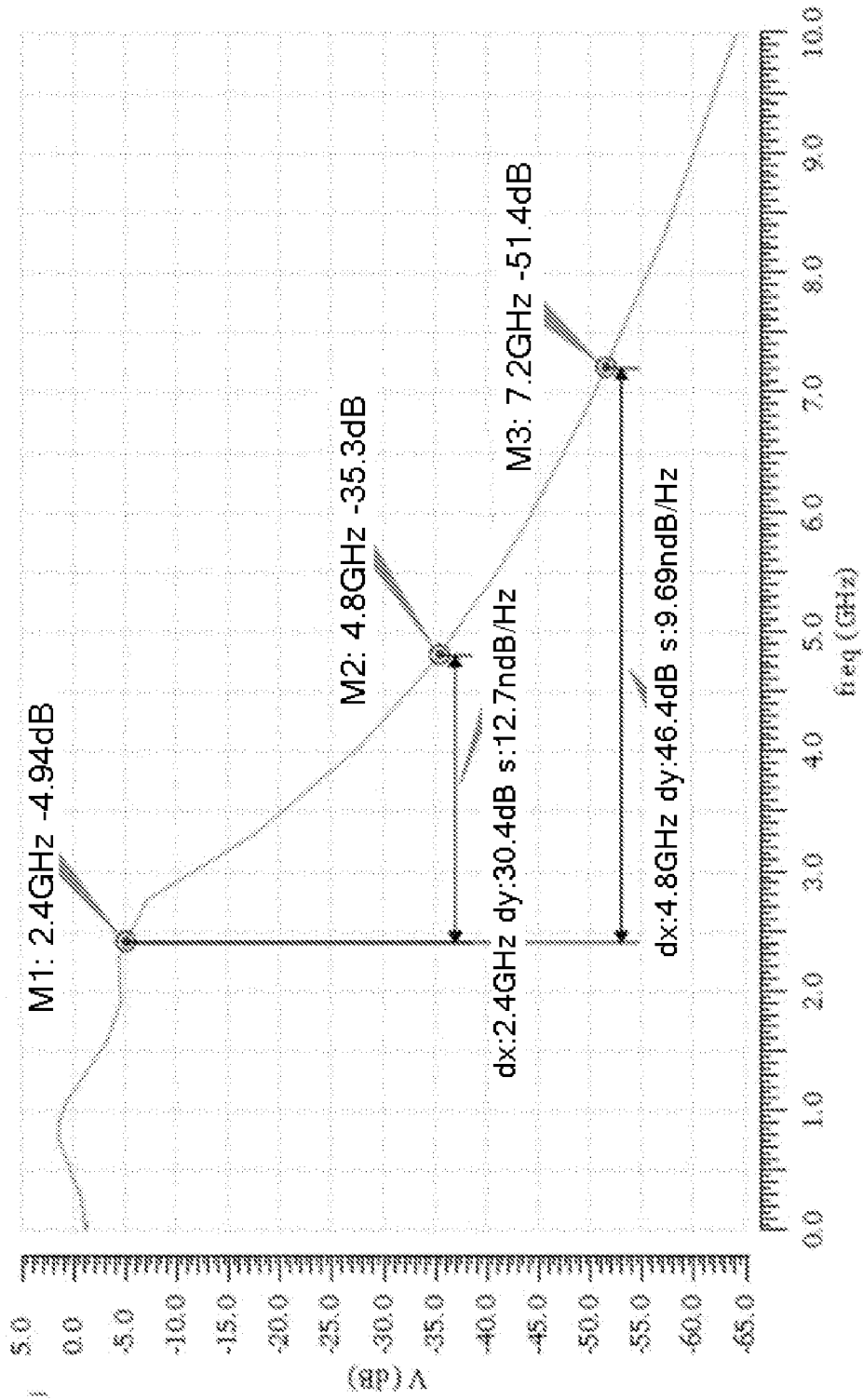
FIG. 7 illustrates the frequency response of the low pass filter of FIG. 6.

Referring now to FIGS. 6 and 7, the low pass filter 19 can be a four-order LC ladder filter, as shown. The pass band can be set to be from about 2.4 GHz to about 2.5 GHz. The low pass filter 19 can provide about 30 dB attenuation of the second harmonic, and about 46 dB attenuation of the third harmonic, as shown in FIG. 7. The load impedance is also transformed by the low pass filter 19 to the desired impedance of the power amplifier 10. The low pass filter 19 can be formed on the same chip as the other components of the power amplifier 10, such as the driving amplifier 12 and the power amplifier units 14.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Claim elements and steps herein may have been numbered and/or lettered solely as an aid in readability and understanding. Any such numbering and lettering in itself is not intended to and should not be taken to indicate the ordering of elements and/or steps in the claims.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different ones of the disclosed elements.

The words used in this specification to describe the invention and its various embodiments are to be understood not only in the sense of their commonly defined meanings, but to include by special definition in this specification the generic structure, material or acts of which they represent a single species.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what incorporates the essential idea of the invention.

What is claimed is:

1. A power amplifier comprising:
   a driving amplifier receiving an input signal, passing the input signal through PMOS and NMOS transistors and providing a driving amplifier output signal; and
   at least one power amplifier unit providing class-D amplification of the driving amplifier output signal to provide a power amplifier output signal, wherein:
   a voltage of the driving amplifier output signal controls a duty cycle of the power amplifier output signal; and
   a duty cycle control signal is provided to the driving amplifier to control activation of one or more PMOS transistors and one or more NMOS transistors, wherein the duty cycle control signal controls a duty cycle of the power amplifier.

2. The power amplifier of claim 1, further comprising a low pass filter receiving the power amplifier output signal.

3. The power amplifier of claim 2, wherein the low pass filter is a four-order inductor-capacitor filter.

4. The power amplifier of claim 3, wherein the low pass filter has a pass band of about 2.4 to about 2.5 GHz and provides about 30 dB attenuation of a second harmonic.

5. The power amplifier of claim 1, wherein each of the at least one power amplifier unit includes a first power electronics arrangement having a first set of transistors and a second set of transistors, wherein the driving amplifier output signal is split to feed each of the first and second set of transistors, wherein each of the first and second sets of transistors include a PMOS transistor and an NMOS transistor, wherein an output from the first power electronics arrangement is provided to a second power electronics arrangement having an architecture the same as the first power electronics arrangement, wherein a first and second output from the second power electronics arrangement is provided to a p-type transistor and an n-type transistor, respectively, to provide the power amplifier output signal.

6. The power amplifier of claim 5, wherein a driving capability of the first set of transistors is designed to be stronger than that of the second set of transistors, wherein a first rising edge of the first output happens earlier than a second rising edge of the second output, and the ratio of $S_{PMN2}$ to $S_{NMN2}$ is designed smaller than that of $S_{PMP2}$ to $S_{NMP2}$, where S denotes the ratio of transistor's channel width to length, preventing shoot through.

7. A method of amplifying a signal with a power amplifier, comprising:
   providing the signal to a driving amplifier;
   controlling the driving amplifier with a duty cycle control signal to increase or decrease an output voltage of the driving amplifier, wherein a greater output voltage provides a decreased duty cycle of the power amplifier;
   providing a driving amplifier output signal to a power amplifier unit, the power amplifier unit providing a class-D power amplification of the signal; and
   outputting a power amplifier output signal from the power amplifier unit.

8. The method of claim 7, further comprising passing the power amplifier output signal through a low pass filter.

9. The method of claim 8, further comprising transforming a load impedance by the low pass filter to a desired impedance of the power amplifier.

10. The method of claim 8, wherein the low pass filter is a four-order inductor-capacitor filter.

11. The method of claim 10, wherein the low pass filter has a pass band of about 2.4 to about 2.5 GHz and provides about 30 dB attenuation of a second harmonic.

12. The method of claim 7, wherein the power amplifier unit includes a first power electronics arrangement having a first set of transistors and a second set of transistors, wherein the driving amplifier output signal is split to feed each of the first and second set of transistors, wherein each of the first and second sets of transistors include a PMOS transistor and an NMOS transistor, wherein an output from the first power electronics arrangement is provided to a second power electronics arrangement having an architecture the same as the first power electronics arrangement, wherein a first and second output from the second power electronics arrangement is provided to a p-type transistor and an n-type transistor, respectively, to provide the power amplifier output signal.

13. The method of claim 12, further comprising designing a driving capability of the first set of transistors to be stronger than that of the second set of transistors, wherein a first rising edge of the first output happens earlier than a second rising edge of the second output, and the ratio of $S_{PMN2}$ to $S_{NMN2}$ is designed smaller than that of $S_{PMP2}$ to $S_{NMP2}$, where S denotes the ratio of transistor's channel width to length, preventing shoot through.

14. The method of claim 7, wherein the duty cycle control signal controls activation of one or more PMOS transistors and one or more NMOS transistors of the driving amplifier to adjust the voltage of the driving amplifier output signal.

15. A method of amplifying a signal with a power amplifier, comprising:
providing the signal to a driving amplifier;
controlling the driving amplifier with a duty cycle control signal to increase or decrease an output voltage of the driving amplifier, wherein a greater output voltage provides a decreased duty cycle of the power amplifier;
providing a driving amplifier output signal to a power amplifier unit, the power amplifier unit providing a class-D power amplification of the signal;
outputting a power amplifier output signal from the power amplifier unit;
conditioning the power amplifier output signal with an inductor-capacitor filter, wherein
the power amplifier unit includes a first power electronics arrangement having a first set of transistors and a second set of transistors, wherein the driving amplifier output signal is split to feed each of the first and second set of transistors, wherein each of the first and second sets of transistors include a PMOS transistor and an NMOS transistor, wherein an output from the first power electronics arrangement is provided to a second power electronics arrangement having an architecture the same as the first power electronics arrangement, wherein a first and second output from the second power electronics arrangement is provided to a p-type transistor and an n-type transistor, respectively, to provide the power amplifier output signal; and the method further includes: designing a driving capability of the first set of transistors to be stronger than that of the second set of transistors, wherein a first rising edge of the first output happens earlier than a second rising edge of the second output, and the ratio of $S_{PMN2}$ to $S_{NMN2}$ is designed smaller than that of $S_{PMP2}$ to $S_{NMP2}$, where S denotes the ratio of transistor's channel width to length, preventing shoot through.

16. The method of claim 15, further comprising transforming a load impedance by the low pass filter to a desired impedance of the power amplifier.

17. The method of claim 15, wherein the low pass filter has a pass band of about 2.4 to about 2.5 GHz and provides about 30 dB attenuation of a second harmonic.

* * * * *